(12) United States Patent
Miyata et al.

(10) Patent No.: US 8,927,461 B2
(45) Date of Patent: Jan. 6, 2015

(54) SUBSTRATE FOR FABRICATING SUPERCONDUCTIVE FILM, SUPERCONDUCTIVE WIRES AND MANUFACTURING METHOD THEREOF

(75) Inventors: Seiki Miyata, Tokyo (JP); Hiroyuki Fukushima, Nikko (JP); Reiji Kuriki, Tokyo (JP); Akira Ibi, Tokyo (JP); Masateru Yoshizumi, Tokyo (JP); Akio Kinoshita, Kasugai (JP); Yutaka Yamada, Tokyo (JP); Yuh Shiohara, Tokyo (JP); Ryuji Yoshida, Nagoya (JP); Takeharu Kato, Nagoya (JP); Tsukasa Hirayama, Nagoya (JP)

(73) Assignees: International Superconductivity Technology Center, Tokyo (JP); Furukawa Electric Co., Ltd., Tokyo (JP); Japan Fine Ceramics Center, Aichi (JP)

( * ) Notice: Subject to any disclaimer, the term of this patent is extended or adjusted under 35 U.S.C. 154(b) by 621 days.

(21) Appl. No.: 13/112,463

(22) Filed: May 20, 2011

(65) Prior Publication Data

US 2011/0218113 A1 Sep. 8, 2011

Related U.S. Application Data

(63) Continuation of application No. PCT/JP2009/069653, filed on Nov. 19, 2009.

(30) Foreign Application Priority Data

Nov. 21, 2008 (JP) ................... 2008-297703

(51) Int. Cl.
*H01L 39/24* (2006.01)
*H01B 12/06* (2006.01)
*H01B 13/00* (2006.01)

(52) U.S. Cl.
CPC ................. *H04L 39/2461* (2013.01)
USPC ........... 505/470; 505/237; 505/238; 505/434; 427/62; 427/126.3; 428/472; 428/701; 174/125.1

(58) Field of Classification Search
CPC ....... H01L 39/12; H01L 39/24; H01L 39/248; H01L 39/2451; H01L 39/2454; H01L 39/2458; H01L 39/2461; H01B 12/06; H01B 13/00; Y02E 40/642; C04B 35/45
USPC ......... 505/230, 234, 236–239, 430, 434, 470, 505/704; 427/62, 63, 126.3; 428/479, 702, 428/930, 457, 469, 472, 697, 698, 701; 174/125.1

See application file for complete search history.

(56) References Cited

U.S. PATENT DOCUMENTS 5,958,599 A * 9/1999 Goyal et al. ................... 428/457
6,226,858 B1 * 5/2001 Matsumoto et al. ............ 29/599

(Continued)

FOREIGN PATENT DOCUMENTS

CN 1833295 9/2006
EP 0884787 8/2009

(Continued)

OTHER PUBLICATIONS

International Preliminary Report on Patentability for PCT Patent Application No. JP2009/069653 dated Jun. 21, 2011, 6 pages.

(Continued)

*Primary Examiner* — Stanley Silverman
*Assistant Examiner* — Kallambella Vijayakumar
(74) *Attorney, Agent, or Firm* — Amin, Turocy & Watson, LLP

(57) ABSTRACT

Provided is a substrate for superconductive film formation, which includes a metal substrate, and an oxide layer formed directly on the metal substrate, containing chromium oxide as a major component and having a thickness of 10-300 nm and an arithmetic average roughness Ra of not more than 50 nm. A method of manufacturing a substrate for superconductive film formation, which includes forming an oxide layer directly on a metal substrate, the oxide layer containing chromium oxide as a major component and having a thickness of 10-300 nm and an arithmetic average roughness Ra of not more than 50 nm.

5 Claims, 4 Drawing Sheets

(56) References Cited

U.S. PATENT DOCUMENTS

| | | | |
|---|---|---|---|
| 6,800,591 B2 * | 10/2004 | Jia et al. | 505/237 |
| 2003/0144150 A1 * | 7/2003 | Arendt et al. | 505/237 |
| 2007/0149410 A1 | 6/2007 | Xiong | |
| 2007/0238619 A1 * | 10/2007 | Xiong | 505/100 |

FOREIGN PATENT DOCUMENTS

| | | | | |
|---|---|---|---|---|
| JP | 64-81116 | | 3/1989 | |
| JP | 2614948 | | 5/1997 | |
| JP | 11-3620 | | 1/1999 | |
| JP | 2001-110255 | | 4/2001 | |
| JP | 2001-110256 | * | 4/2001 | H01B 12/06 |
| JP | 3251034 | | 1/2002 | |
| JP | 3532253 | | 5/2004 | |
| JP | 2004-171841 | | 6/2004 | |
| JP | 3771012 | | 4/2006 | |
| JP | 2007-73327 | | 3/2007 | |
| WO | WO2005/015575 | | 2/2005 | |
| WO | 2007/030546 | | 3/2007 | |

OTHER PUBLICATIONS

Chinese Office Action mailed Aug. 31, 2012 for Chinese Patent Application Serial No. 2009801463807, 12 pages (with translation).

CN OA dated Dec. 23, 2011 for Chinese Application No. 200980146380.7, 16 pages.

Japanese Office Action mailed on Jun. 18, 2013 for Japanese Patent Application No. 2008-297703, 7 pages.

International Search Report for International Application No. PCT/JP2009/069653, mailing date Feb. 23, 2010, 3 pages.

European Search Report dated Jul. 11, 2014 for European Application No. 09827604.1-1564/2360701, 7 pages.

Huhne, et al., "Texture and microstructure analysis of epitaxial oxide layers prepared on textured Ni-12wt%Cr tapes". Journal of Physics D: Applied Physics, May 7, 2003, pp. 1053-1057—XP055113428. URL: http://iopscience.iop.org/0022-3727/36/9/301. Retrieved on Apr. 10, 2014, 3 pages.

* cited by examiner

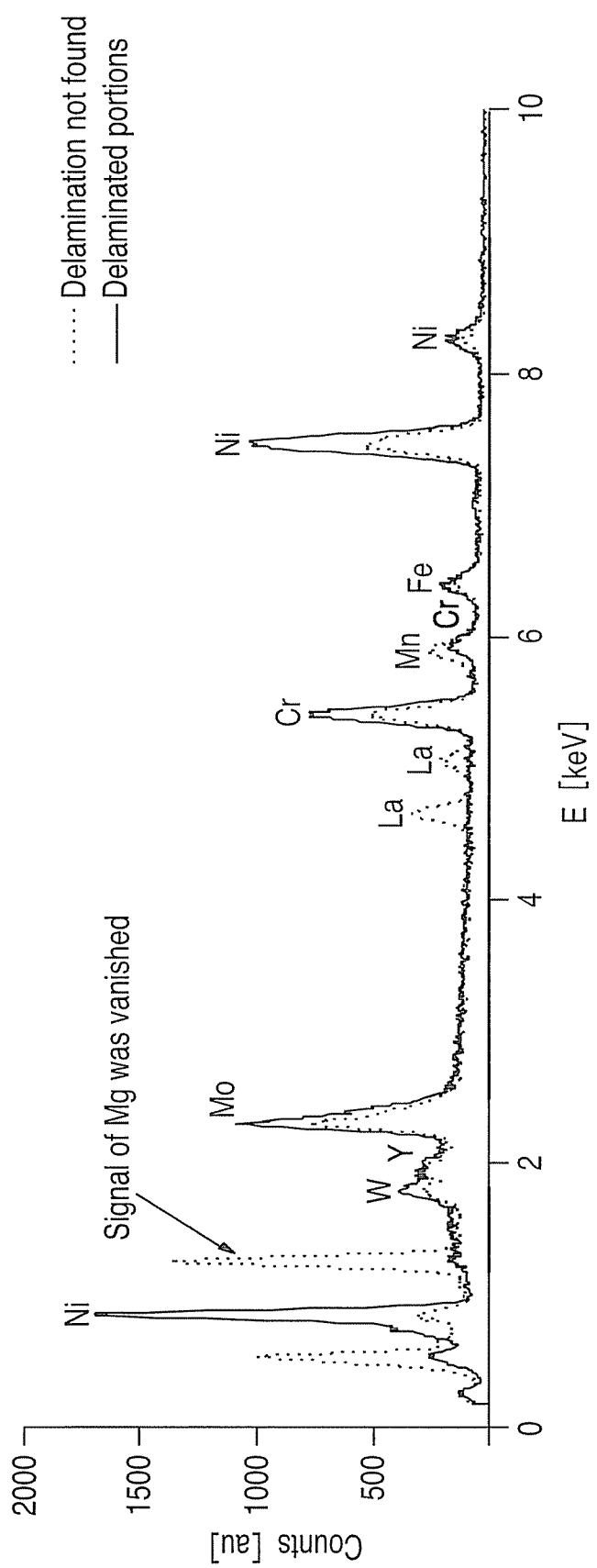
F I G. 3

500nm

SUBSTRATE FOR FABRICATING SUPERCONDUCTIVE FILM, SUPERCONDUCTIVE WIRES AND MANUFACTURING METHOD THEREOF

CROSS REFERENCE TO RELATED APPLICATIONS

This is a Continuation Application of PCT Application No. PCT/JP2009/069653, filed Nov. 19, 2009, which was published under PCT Article 21(2) in Japanese and is incorporated by reference herein.

This application is based upon and claims the benefit of priority from prior Japanese Patent Application No. 2008-297703, filed Nov. 21, 2008, the entire contents of which are incorporated herein by reference.

BACKGROUND OF THE INVENTION

1. Field of the Invention

This invention relates to a substrate for superconductive film fabrication to be employed on the occasion of manufacturing oxide superconductive wires through the deposition of a superconductive film on a substrate. This invention also relates to superconductive wires having a superconductive film fabricated on the substrate and to manufacturing methods of the substrate and the superconductive wires.

2. Description of the Related Art

Conventionally, there have been proposed a many number of ideas for manufacturing oxide superconductive wires through the deposition of a superconductive film on a substrate (see for example, Japanese Patents No. 2614948; No. 3251034; No. 3532253; and No. 3771012; and JP-A 2001-110255 and JP-A 11-3620).

Among them, an oxide superconductive wire utilizing an oxide superconductor represented by a composition formula of $REBa_2Cu_3O_{7-d}$ (wherein RE means rare earth elements, also referred to as 123-type or yttrium-type superconductor), the oxide superconductor being deposited on a tape-like metal substrate to make the wire flexible, is known to attain excellent current characteristics. For this reason, this oxide superconductive wire is one of the oxide superconductive wires that are intensively studied and developed at present. Under the circumstances, the studies on this oxide superconductive wire have been advanced to such a stage that a large number of prototypes concerning electric power equipments and the like utilizing this oxide superconductive wire have been manufactured.

Therefore, in the art of manufacturing oxide superconductive wires, it is now strongly desired to establish a mass production system aiming at industrialization for the production of superconductive wires, so that we are now faced with a situation where the development of highly reliable and stable process for the production of superconductive wires is urgently needed.

The fact that a thin-film oxide superconductor is capable of exhibiting excellent current characteristics has been already confirmed through experiments on the oxide superconductor deposited as a thin film on the surface of a monocryatalline substrate. When a monocryatalline substrate is to be used however, it is impossible to freely bend it and to work it to obtain an elongated strip having a length of several hundreds meters, thus making it unrealistic.

In any attempt for the practical use or industrialization of the oxide superconductive wires, it is imperative to work the oxide superconductor into a wire-like member having the same degree of flexibility as metals. For this reason, it has been attempted to deposit an oxide superconductor as a thin film on a tape-like metal substrate to thereby enable the resultant substrate to exhibit a function useful as a practical wire. However, it has been found that, in the case of the superconductive thin film which has fundamentally a polycrystalline structure, it is impossible to obtain excellent current characteristics unless a large number of crystal grains constituting the thin film are uniformly arrayed in the same direction.

However, as conducted in the ion beam assist vapor deposition (IBAD) method, inclined substrate deposition (ISD) method, or a method employing an orientated metal, this problem has been already solved by using a substrate where a large number of crystal grains constituting the substrate are orientated in the same direction as a substrate for superconductive film formation.

Further, as a result of considering the matching of lattice constant, reactivity of substrate to the superconductive film, etc. in addition to the orientation of crystal, the development of the superconductive wires is now generally directed to the wires wherein at least one oxide layer called intermediate layer other than a superconductive layer is deposited on a metal substrate and then a superconductive layer is deposited on the intermediate layer, thereby obtaining a wire having a multi-layer structure.

By means of this multi-layer structure, it is now possible to obtain wires which are capable of exhibiting excellent current characteristics even on a metal substrate, e.g., a current density of more than $10^6$ A/cm$^2$ at liquid nitrogen temperature (77K) or a current density of more than $10^7$ A/cm$^2$ at liquid helium temperature (4.2K), the wires moreover being flexible.

However, when the practical use or industrialization of the oxide superconductive wires is taken into consideration, it is imperative to further improve the manufacturing speed of the wires. Thus, it is strongly desired, at present, to improve the manufacturing speed of the wires in the art of manufacturing oxide superconductive wires.

BRIEF SUMMARY OF THE INVENTION

Problems to be Solved by the Invention

In order to improve the manufacturing speed of wires in the art of manufacturing oxide superconductive wires, it is conceivable at first to reduce the thickness of layers in all of the film-fabricating processes. However, if the thickness of layers is reduced, the problem of delamination would become more serious.

For example, in the process of successively depositing intermediate layers on a substrate to form a film structure with the thickness thereof reaching to 1000 nm or more, delamination between the deposited layers may occur. Further, when a prescribed heat treatment is applied to the film structure after the deposition of a superconductive layer, delamination between the deposited layers may occur in the same manner.

Reasons for this phenomenon can be explained as follows. Namely, when the film thickness of each of layers is sufficiently large, the diffusion of elements can be suppressed. However, when the film thickness is reduced, the influences of the interdiffusion and interfacial reaction between the layers cannot be disregarded.

The present invention has been accomplished in view of the aforementioned circumstances and therefore the objects of the present invention are to provide a substrate for superconductive film formation, which is capable of avoiding delamination between deposited films in the process of depositing films or during the heat treatment after finishing the deposition of films, and to provide superconductive wires as well as the manufacturing methods of them.

Means for Solving the Problems

According to a first aspect of the present invention, there is provided a substrate for superconductive film formation, which comprises: a metal substrate; and an oxide layer formed directly on the metal substrate and containing chromium oxide as a major component.

In the substrate for superconductive film formation, the metal substrate may contain Ni-based alloy or Fe-based alloy. In this case, the Ni-based alloy or Fe-based alloy may contain Cr at a ratio of 10-30 mass %.

The oxide layer has preferably an arithmetic average roughness Ra of not more than 50 nm.

The metal substrate has preferably an arithmetic average roughness Ra of not more than 50 nm.

The oxide layer has preferably a thickness of 10-300 nm.

The substrate may further comprise an intermediate layer for forming a superconductive film thereon, formed on the oxide layer. In this case, the intermediate layer may contain $Y_2O_3$ or $Gd_2Zr_2O_7$. Further, the intermediate layer may be provided with an underlying layer containing $Al_2O_3$. The intermediate layer may have an arithmetic average roughness Ra of not more than 50 nm.

According to a second aspect of the present invention, there is provided a superconductive wire which is provided with a superconductive layer formed on the substrate according to the first aspect of the present invention.

According to a third aspect of the present invention, there is provided a method of manufacturing a substrate for superconductive film formation, which comprises forming an oxide layer directly on a metal substrate, the oxide layer containing chromium oxide as a major component.

According to a fourth aspect of the present invention, there is provided a method of manufacturing a substrate for superconductive film formation, which comprises forming a chromium layer directly on a metal substrate, and oxidizing the chromium layer to thereby form an oxide layer containing chromium oxide as a major component.

According to a fifth aspect of the present invention, there is provided a method of manufacturing a substrate for superconductive film formation, which comprises coating an aqueous solution containing chromium on an upper surface of a metal substrate, and heating the coated layer to form an oxide layer containing chromium oxide as a major component.

A intermediate layer for forming a superconductive film thereon may be formed on the oxide layer.

According to a sixth aspect of the present invention, there is provided a method of manufacturing a substrate for superconductive film fabrication, which comprises forming an intermediate layer on a metal substrate containing chromium, and heating the metal substrate to a temperature of not higher than 700° C. in an atmosphere containing oxygen to thereby form, between the metal substrate and the intermediate layer, an oxide layer containing chromium oxide as a major component.

In the third to sixth aspects, the metal substrate may contain Ni-based alloy or Fe-based alloy. In this case, the Ni-based alloy or Fe-based alloy may contain Cr at a ratio of 10-30 mass %.

The oxide layer has preferably an arithmetic average roughness Ra of not more than 50 nm.

The metal substrate has preferably an arithmetic average roughness Ra of not more than 50 nm.

The oxide layer has preferably a thickness of 10-300 nm.

The substrate may further comprise an intermediate layer for depositing a superconductive film thereon, formed on the oxide layer. In this case, the intermediate layer may contain $Y_2O_3$ or $Gd_2Zr_2O_7$. Further, the intermediate layer may be provided with an underlying layer containing $Al_2O_3$. The intermediate layer may have an arithmetic average roughness Ra of not more than 50 nm.

According to a seventh aspect of the present invention, there is provided a method of manufacturing a superconductive wire, which comprises forming, as an underlying layer, an intermediate layer containing $Al_2O_3$ on a metal substrate formed of an alloy containing chromium, and heating the metal substrate to a temperature of not lower than 750° C., thereby not only forming a superconductive film on a surface of the intermediate layer but also forming, between the metal substrate and the intermediate layer, an oxide layer containing chromium oxide as a major component.

Advantage of the Invention

According to the present invention, it is possible to provide a substrate for superconductive film fabrication, which is capable of avoiding delamination between deposited films during the process of depositing a film or in the heat treatment to be performed after the deposition of a film and to provide a manufacturing method thereof. Further, it is made possible, through the employment of such a substrate, to manufacture oxide superconductive wires which are excellent in superconductive characteristics and in reliability while making it possible to enhance productivity and manufacturing speed and to reduce the manufacturing cost.

BRIEF DESCRIPTION OF THE SEVERAL VIEWS OF THE DRAWING

FIG. 3 is a graph illustrating one example of the results obtained from the measurement of an energy dispersive X-ray (EDX) spectrum of the surface of film;

DETAILED DESCRIPTION OF THE INVENTION

There will now be explained various embodiments of the present invention in detail.

As a result of studies made by the present inventors on the causes of delamination between deposited films, it has been found that the formation of an oxide layer containing chromium as a major component so as to interpose the oxide layer between deposited layers is effective as means for solving the problem of delamination. Followings are explanations on the processes of reaching to the aforementioned idea proposed by the present inventors and on the details of specific embodiments of the invention.

As described above, in the process of successively depositing intermediate layers on a substrate to form a film structure with the thickness thereof reaching to 1000 nm or more, delamination between the deposited layers may be caused. Further, when a prescribed heat treatment is applied to the film structure after the deposition of a superconductive layer, delamination between the deposited layers may be caused in the same manner. In this case, the phenomenon of delamination between the deposited layers occurs for the following reasons.

Figure 1:
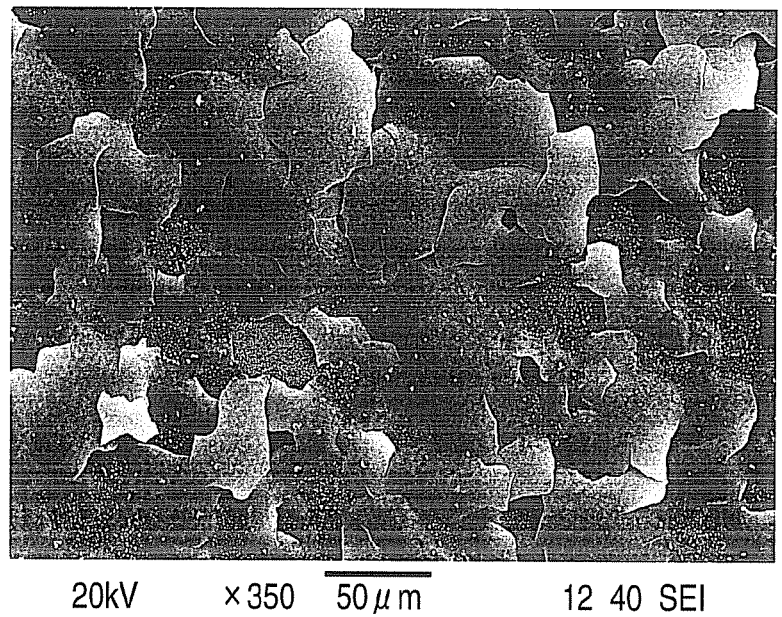
FIG. 1 is a photograph showing the delamination phenomenon that was observed in a laminate structure where a $Y_2O_3$ layer, an IBAD-MgO layer and an epitaxial MgO layer were successively deposited on the surface of a metal substrate and then a GdBCO layer was deposited thereon at a high temperature of not less than 750° C.

FIG. 1 shows the phenomenon of delamination which was observed in a laminate structure where an $Y_2O_3$ layer, an IBAD-MgO layer and an epitaxial MgO layer were successively deposited on the surface of a metal substrate and then a GdBCO layer was deposited thereon at a high temperature of not less than 750° C. Likewise, FIG. 2 shows the delamination phenomenon that was observed in a laminate structure where an $Y_2O_3$ layer, an IBAD-MgO layer and an epitaxial MgO layer were successively deposited on the surface of a metal substrate and then an $LaMnO_3$ layer was deposited thereon at high temperatures.

In the case of FIG. 1, delaminated pieces can be recognized all over the surface. In the case of FIG. 2, light gray portions indicates delaminated portions and delaminated pieces (the portions having white profile in FIG. 2) can be recognized at several places.

Figure 2:
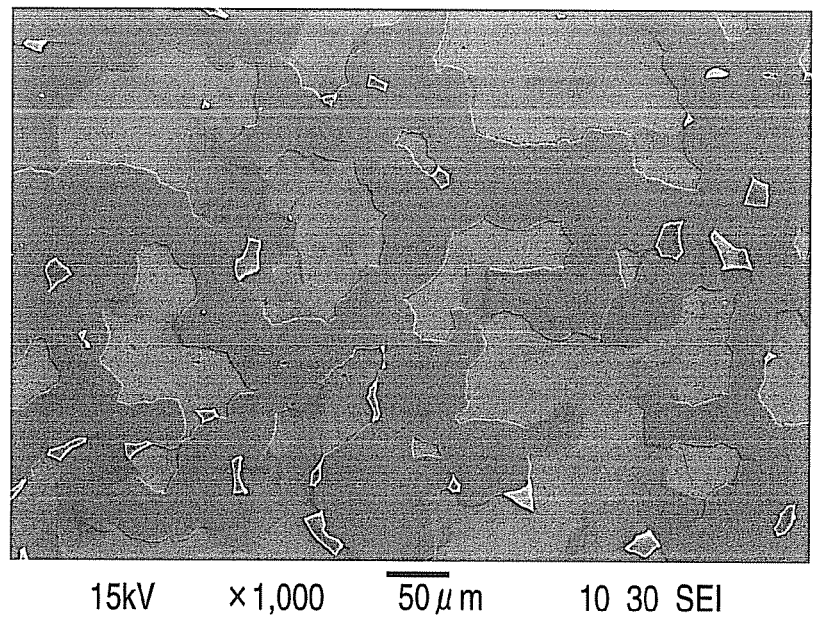
FIG. 2 is a photograph showing the delamination phenomenon that was observed in a laminate structure where a $Y_2O_3$ layer, an IBAD-MgO layer and an epitaxial MgO layer were successively deposited on the surface of a metal substrate and then an $LaMnO_3$ layer was deposited thereon at a high temperature.

In order to confirm a specific location of the stage in the process of creating the laminate structure that brings about the delamination as shown in FIGS. 1 and 2, the present inventors have conducted the measurement of an EDX spectrum of the film surface. One example of the results obtained is shown in FIG. 3.

Since the measurement of the EDX spectrum is a technique of performing elemental analysis through the detection of characteristic X-ray that has been emitted, it is possible, through the utilization of this technique, to confirm the existence or nonexistence of specific elements in a region of as deep as about 1 to several micrometers from the surface and also to confirm the locations of the elements existed.

As shown in FIG. 3, although the signal of Y was obtained from the EDX spectrum at portions where the delamination occurred, the signal of Mg was not obtained therefrom, thus making it possible to determine that the IBAD-MgO layer was delaminated.

Based on this fact, the present inventors have determined that the cause for the delamination was originated from the IBAD-MgO layer. Based on this determination, any change taking place in the IBAD-MgO layer was fully investigated. For this purpose, the present inventors have prepared a sample which was obtained by stopping the film deposition process at an intermediate stage where the deposition of IBAD-MgO layer was finished (namely, a sample where the uppermost layer was constituted by the IBAD-MgO layer). Then, this sample was exposed to a high-temperature environment which induced delamination, after which the surface of the IBAD-MgO layer was observed by means of a scanning electron microscope (SEM).

As a result, the existence of a large number of cracks expectedly giving a cause for the delamination was recognized on the surface of IBAD-MgO layer. However, when the surface features of the IBAD-MgO layer was measured by means of an atomic force microscope (AFM), the depth of these cracks was so deep that the dimension thereof was not less than the film thickness of the IBAD-MgO layer. Additionally, when the metal substrate employed for creating the sample and having no layer deposited thereon was exposed to the same high-temperature environment as described above, cracks having the similar features were recognized.

It has been found from the results obtained from these observations that, in conclusion, the cause of the delamination was not the cracking of the IBAD-MgO layer but the cracking of the metal substrate and that the cracking of the metal substrate was due to the reaction on the surface of the metal substrate. Namely, it can be said that the cause of the delamination originated from some sort of interface reaction (for example, oxidizing reaction) occurring on the surface of the metal substrate.

It is generally widely known that when elemental Cr is added to Ni-based alloys or Fe-based alloys, the oxidation resistance of these alloys can be remarkably enhanced. Stainless steel and the like are representative examples thereof. This phenomenon can be attributed to the formation of an oxide layer (so-called passivation layer) containing elemental Cr as a major component thereof in the vicinity of the surface of alloy.

Accordingly, the present inventors have considered that, by the formation of an oxide layer containing elemental Cr as a major component in the vicinity of the surface of the substrate for superconductive film formation, it may be also possible to suppress the interface reaction that may become a cause for the delamination. Based on this idea, the following experiments were performed.

A GZO layer was deposited on the surface of a metal substrate made of Hastelloy which is an Ni alloy containing 15 mass % of Cr and then an IBAD-MgO layer was further formed thereon. Then, the resultant laminate was exposed to a high-temperature environment which were likely to induce delamination (e.g., about 800° C. for one hour), thereby obtaining the results shown in FIG. 4.

Likewise, a GZO layer was deposited on the surface of a substrate made of Hastelloy which is an Ni alloy containing 15 mass % of Cr. Then, the resultant laminate was subjected to oxygen annealing treatment at 500° C. in an atmosphere of 100% oxygen under a pressure of 1 atm. Then, an IBAD-MgO layer was further deposited thereon. Thereafter, the resultant laminate was exposed to a high-temperature environment which were likely to induce delamination (e.g., about 800° C. for one hour), thereby obtaining the results shown in FIG. 5.

Figure 4:
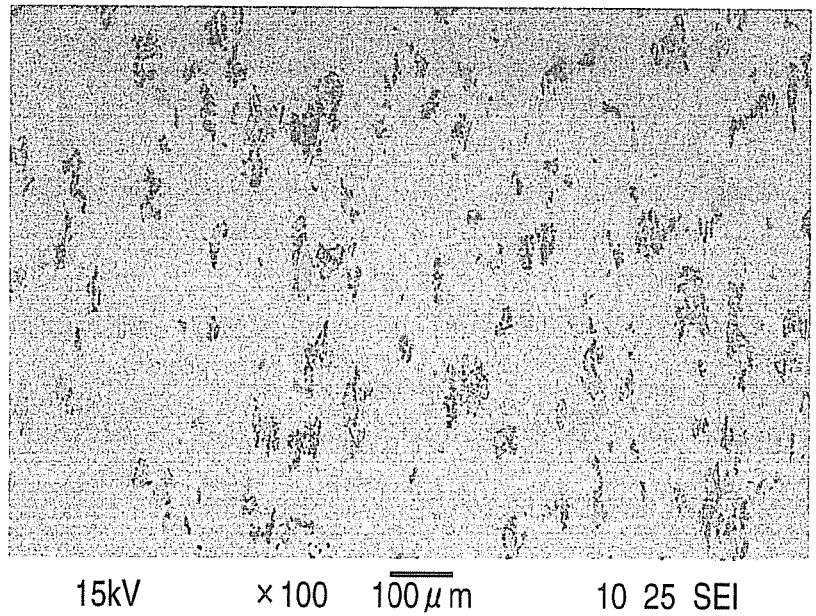
FIG. 4 is a photograph showing the results obtained when a sample having formed layers on the surface of a metal substrate was exposed to a high-temperature environment, wherein the sample employed was constructed such that a two-ply laminate comprising, as an intermediate layer, a $Gd_2Zr_2O_7$ layer and an IBAD-MgO layer was deposited on the surface of the metal substrate, the sample being not subjected to an oxygen annealing treatment.
Figure 5:
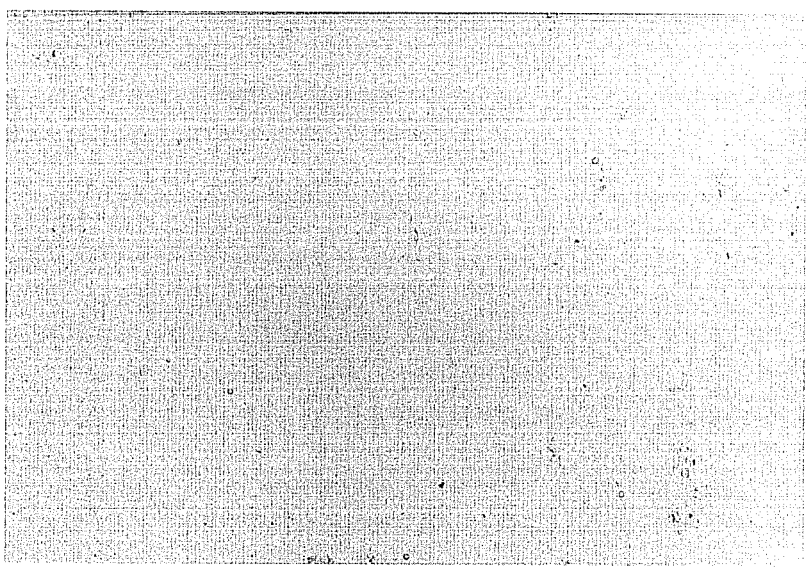
FIG. 5 is a photograph showing the results obtained when a sample having formed layers on the surface of a metal substrate was exposed to a high-temperature environment, wherein the sample employed was constructed such that a $Gd_2Zr_2O_7$ layer and an IBAD-MgO layer were deposited as intermediate layers on the surface of the metal substrate, sample being subjected to an oxygen annealing treatment.

It will be recognized that, in the case of the sample which was not subjected to the oxygen annealing treatment, a white and black spotted pattern indicating cracks and of interlayer reaction was observed as shown in FIG. 4, while in the case of the sample which was subjected to the oxygen annealing treatment, a white and black spotted pattern was not observed as shown in FIG. 5, thus making it possible to suppress the cracks and interlayer reaction.

As described above, when an MgO layer is deposited, via an intermediate layer, on the surface of Hastelloy substrate, the MgO layer may be caused to delaminate. Although it is already recognized through EDX analysis that this delamination is caused at the MgO layer, it is assumed that the cause for this delamination originates not from the MgO layer, but from the Hastelloy substrate.

Firstly, when a Hastelloy substrate having no formed layer thereon was exposed to a high-temperature environment (e.g., about 800° C. for one hour), cracks were caused on the surface of the Hastelloy substrate. However, the state of cracking was quite similar to the cracking that could be observed on the surface of the IBAD-MgO layer.

Secondly, it has been found that, in the case of the sample which was not subjected to oxygen annealing treatment and, as a result, caused cracking, when the surface state of the sample was measured by means of atomic force microscopy (AFM), the depth of cracking was larger than the film thickness of the MgO layer. For example, the depth of cracking was 100 nm as an MgO layer having a film thickness of not more than 10 nm was employed.

In view of these results, it cannot be said that the cracking was produced singly in the interior of the MgO layer because of the high-temperature heat treatment. Rather, they strongly indicate that the cracking occurred on the surface of Hastelloy substrate.

Therefore, the delamination can be assumably attributed to the cracking on the surface of the substrate and/or to the deformation of the surface of the substrate due to the local volume change in the process of the transformation of metallic state to an oxide state as a result of the oxidation of the surface of Hastelloy substrate, thereby leading to the production of high inner stress entirely in the upper film.

Among a plurality of films constituting the upper layers, the IBAD-MgO layer is thinnest and moreover this IBAD-MgO layer is interposed at a discontinuous interface of a two-layer structure consisting of a lower layer of amorphous or microcrystalline state and an upper layer of almost completely crystallized and biaxially orientated state. As a result, a stress originating from the cracking and/or deformation of the surface of the substrate is enabled to concentrate at the IBAD-MgO layer, resulting in the delamination of the IBAD-MgO layer.

Therefore, the reason that the oxygen annealing treatment is effective in suppressing the delamination may be assumably attributed to the fact that "an oxide layer containing chromium oxide as a major component" takes the role of preventing the oxidation of the surface of Hastelloy substrate and, as a result, the production of inner stress in the upper layer can be suppressed.

Then, the present inventors have investigated on a problem about if the phenomenon of delamination can be suppressed in a case where an $Al_2O_3$ is deposited, as a barrier layer, directly on the surface of a metal substrate for the purpose of preventing diffusion and reaction.

Namely, a sample having a laminate structure consisting of, from the top, IBAD-MgO/$Y_2O_3$/$Al_2O_3$/Ni-based alloy and a sample having a laminate structure consisting of IBAD-MgO/$Y_2O_3$/Ni-based alloy and not including the $Al_2O_3$ layer were respectively prepared. Then, these samples were respectively exposed to the same high-temperature environment (e.g., about 800° C. for one hour) and the resultant samples were observed by means of the SEM.

As a result, it was confirmed that the cracks observed in the sample which was not provided with $Al_2O_3$ layer were not recognized in the sample which was interposed with $Al_2O_3$ layer. Further, as a matter of fact, it was also confirmed that the sample which was provided with $Al_2O_3$ layer was capable of preventing the phenomenon of delamination even after the process of forming a superconductive layer which was sequentially carried out in a high-temperature environment.

Figure 6A:
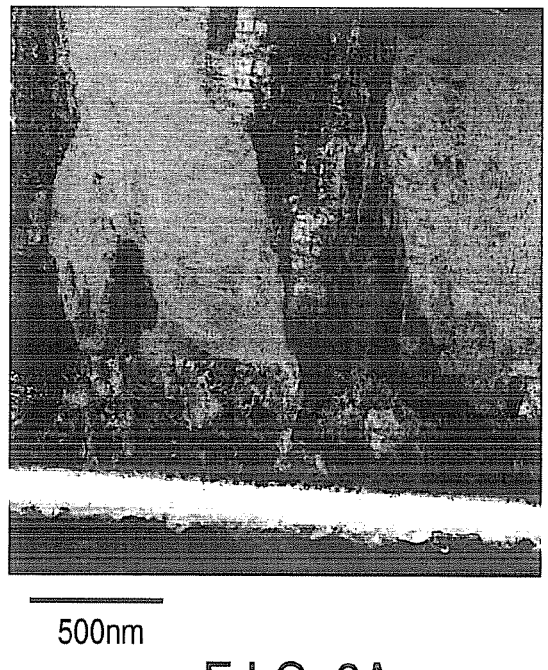
FIG. 6A is a photograph of an image of transmitted electron, obtained when a cross-sectional observation using a transmission electron microscope (TEM) was made on a sample having an $Al_2O_3$ layer interposed between a metal substrate and an intermediate layer.
Figure 6B:
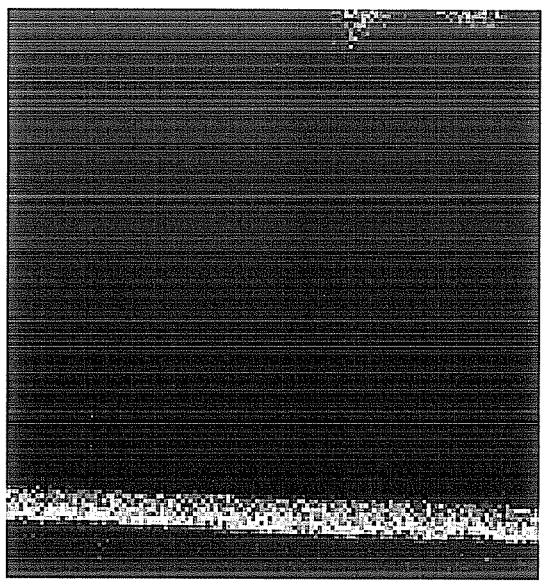
FIG. 6B is a photograph of a distributed state of Al, obtained when a cross-sectional observation using a transmission electron microscope (TEM) was made on a sample having an $Al_2O_3$ layer interposed between a metal substrate and an intermediate layer.
Figure 6C:
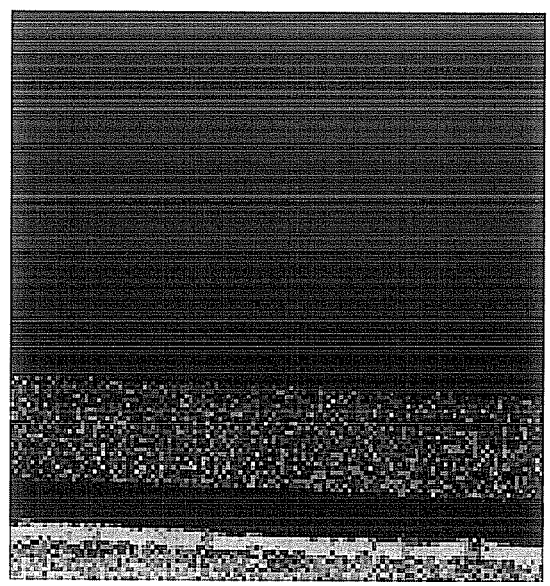
FIG. 6C is a photograph of a distributed state of Cr, obtained when a cross-sectional observation using a transmission electron microscope (TEM) was made on a sample having an $Al_2O_3$ layer interposed between a metal substrate and an intermediate layer.

FIGS. 6A to 6C show the results obtained when a cross-sectional observation using a transmission electron microscope (TEM) was made of the sample which was successful in preventing delamination because of the formation of the $Al_2O_3$ layer.

It will be recognized from FIGS. 6A to 6C that an oxide layer containing Cr as a major component was created at an interface of the $Al_2O_3$ layer/metal substrate. Followings are specific explanation on this phenomenon.

FIG. 6A illustrates an image of transmitted electron, which indicates the fact that ⅔ of the upper region of this image was occupied by the superconductive layer (about 1 μm). Below this superconductive layer, there is a $CeO_2$ layer (about 500 nm) and below this $CeO_2$ layer, there are disposed the metal substrate and the $Al_2O_3$-$LaMnO_3$ layer.

When the structure in the vicinity of the surface of metal substrate was analyzed by means of the EDX spectrum, it was possible to obtain the distributed states of Al and Cr as shown in FIG. 6B and FIG. 6C, respectively. In FIG. 6B, bright portions represent the $Al_2O_3$ layer. It will be recognized from FIG. 6C that an especially strong signal indicating a high concentration of Cr was obtained from an interface between the $Al_2O_3$ layer and the metal substrate constituting the lowermost layer.

Accordingly, it will be recognized that the measures to interpose an $Al_2O_3$ layer between the substrate and the intermediate layer are also effective in preventing delamination because of the formation of an oxide layer containing Cr as a major component during a subsequent high-temperature process of not lower than 750° C., e.g. during the process of forming the superconductive film.

The present invention has been accomplished based on the aforementioned findings and is characterized in that an oxide layer containing Cr as a major component is provided directly on the surface of a metal substrate in a substrate for superconductive film formation.

The metal substrate constituting a base member of the substrate for superconductive film formation should preferably be selected from those which are excellent in workability (especially, stretchability) or in flexibility. Specifically, it is preferable to employ a metal substrate formed of an Ni-based alloy or an Fe-based alloy. With respect to the formation of an oxide layer containing Cr as a major component directly on the surface of a metal substrate, although a diffusion technique was attempted by the present inventors, the technique for forming the aforementioned oxide layer is not restricted to any particular technique as long as it is possible to form the aforementioned oxide layer.

It is possible to form an oxide layer containing Cr as a major component directly on the surface of a metal substrate by means of a treatment using an acidic solution such as a nitric acid solution or by means of heating in an oxygen atmosphere.

Alternatively, it is also possible to form an oxide layer containing Cr as a major component by means of a method wherein a chromium layer is formed as a first layer directly on the surface of a metal substrate constituting a base member and then the chromium layer is allowed to oxidize in the subsequent film deposition steps.

It is also possible to form an oxide layer containing Cr as a major component by means of a method wherein an aqueous solution containing chromium is coated on the surface of a metal substrate constituting a base body and then the coated layer is heat-treated.

It is also possible to form an oxide layer containing Cr as a major component at an interface between a metal substrate and an intermediate layer by means of a method wherein the intermediate layer is deposited on the surface of a metal substrate made of an alloy containing Cr and then the resultant body is heated to a temperature not higher than 700° C. in an atmosphere containing oxygen.

The atmosphere containing oxygen may be air atmosphere or a 100% oxygen atmosphere. With respect to the heating temperature, it may be confined to not more than 700° C., since when the heating temperature is higher than 700° C., the surface roughness may be deteriorated because of excessively high heating temperatures.

If the diffusion technique is to be employed, the aforementioned Ni-based alloy and Fe-based alloy may preferably be selected from those containing Cr at a ratio of 10-30 mass %.

Specifically, preferable examples of the Ni-based alloy include Hastelloy (trade name), Inconel (trade name), Heinz alloy (trade name), MC alloy (trade name), etc. Preferable examples of the Fe-based alloy include stainless steel, Incoloy (trade name), etc.

It should be noted, if a laminate film structure is to be formed through a step-wise deposition of films, since the surface smoothness of the underlying film gives a great influence to the surface smoothness of the upper film formed directly thereon, it is important to secure the surface smoothness of the metal substrate constituting a base member in order to ultimately form a superconductive film which is excellent in surface smoothness and in electric current characteristics.

The metal substrate to be generally employed has "Ra" falling within the range of 10-20 nm as calendered. It is possible, through the enhancement of surface smoothness of metal substrate, to obtain a thin film exhibiting a high degree of crystal orientation. Therefore, it is preferable to polish the metal substrate before use. However, if the metal substrate is to be covered with a metal chrome, it is possible to employ a metal substrate whose Ra exceeding 20 nm. In this case however, Ra should be confined to not more than 50 nm. In conclusion, the metal substrate useful herein may be selected from those exhibiting: Ra=50 nm or less.

With respect to the film thickness of the "oxide layer containing chromium oxide as a major component" that is designed to be formed directly on the surface of metal substrate, although there is not any particular limitation, the film thickness may preferably be confined to 10-300 nm. If this film thickness is less than 10 nm, it may become difficult to enable the oxide layer to sufficiently exhibit its function of suppressing the delamination because of excessively small film thickness. On the other hand, if this film thickness is larger than 300 nm, it may give rise to cracking or delamination of the chromium layer itself.

It is conceivable that the "oxide layer containing chromium oxide as a major component" may exist taking a formula of spinel-type $NiCr_2O_4$ or spinel-type $FeCr_2O_4$. These formulas respectively illustrate a composition representing an ideal equilibrium state. As a matter of fact however, the atomic ratio thereof does not take the ratio of integer. Namely, in the case of $NiCr_2O_4$, the formula thereof may be $Ni_{1.2}Cr_{1.8}O_{3.9}$ or $(NiO)_{1.2}(Cr_{1.2}O_{1.5})_{1.8}$ for example.

It should be noted that an ideal ratio of elements existing in $NiCr_2O_4$ and in $FeCr_2O_4$ is: Ni (25.9 wt %, 14.3 at %), Cr (45.9 wt %, 28.6 at %), O (28.2 wt %, 57.1 at %) in the case of $NiCr_2O_4$ and Fe (24.9 wt %, 14.3 at %), Cr (46.5 wt %, 28.6 at %), O (28.6 wt %, 57.1 at %) in the case of $FeCr_2O_4$.

It is also conceivable that a smaller quantity (for example, less than 30 mass %) of other metals than that of Cr and of $Cr_2O_3$ is contained as a solid solution in these materials.

In the examples explained above, the "oxide layer containing chromium oxide as a major component" can be represented by a formula of: $Cr_wM'_xM''_y\ldots O_z$ (wherein w, x, y and z are positive integers). Among these metallic elements, the quantity "w" (atomic %) of Cr is the maximum.

With respect to the surface smoothness of the oxide layer containing chromium oxide as a major component, it may preferably be confined to not more than 50 nm in terms of Ra value as in the case of the metal substrate disposed immediately below the oxide layer.

Generally, when films are formed in the manufacture of oxide superconductive wire, an intermediate layer having so-called biaxial orientation structure wherein the crystal orientation of all of the crystal grains constituting the intermediate layer are uniformly aligned is formed on the surface of metal substrate in order to fabricate a superconductive film exhibiting excellent current characteristics. However, it can be sometimes attempted to carry out the orientation of crystal grains at the step of preparing the metal substrate.

Therefore, in the present invention also, an intermediate layer may be deposited on the surface of "oxide layer containing chromium oxide as a major component". When this intermediate layer is deposited as described above, the linkage of superconductivity among the crystal grains constituting the film can be strengthened and the maximum electric current that can be transmitted as a whole can be remarkably enhanced.

With respect to the aforementioned intermediate layer, it is preferable to employ a layer consisting of $Y_2O_3$ or $Gd_2Zr_2O_7$. The $Y_2O_3$ layer or $Gd_2Zr_2O_7$ layer act as a seed layer prompting the creation of the biaxial orientation structure. It should be noted that, as described above, the surface smoothness of the aforementioned intermediate layer may preferably be confined to 50 nm or less in terms of Ra value.

As described above, when the metal substrate is formed of an alloy containing Cr, the deposition of an $Al_2O_3$ layer on the underside of the intermediate layer would be useful in more effectively suppressing the delamination. The reason is the formation of an oxide layer containing chromium oxide as a major component at an interface between the base body and the $Al_2O_3$ layer. The formation of the oxide layer containing chromium oxide as a major component as described above can be achieved for example on the occasion of executing a high-temperature process at a temperature of not lower than 750° C. for depositing a superconductive layer. It should be noted that it is also possible to create an oxide layer containing chromium oxide as a major component at an interface between the metal substrate and the $Al_2O_3$ layer by subjecting the metal substrate to heat treatment in an oxygen atmosphere at a temperature of not lower than 700° C. after depositing the intermediate layer and before depositing the superconductive layer. It is possible, through the employment of the latter method, to more reliably create an oxide layer containing chromium oxide as a major component.

EXAMPLES

Next, specific examples of the present invention will be explained below. The conditions employed in these examples are adopted simply for the purpose of confirming the performability and effects of the present invention. Therefore, the invention is not limited to the specific conditions described therein.

Namely, it is possible, in the present invention, to employ various conditions as long as the spirit of invention is departed and the objects of the invention can be achieved.

Example 1

A base member made of Ni-based alloy (Hastelloy; trademark: Ni-16Cr-15.6Mo-6Fe-4W-2Co) and roll-worked into a tape-like film having a width of 10 mm and a thickness of 100 μm was employed as a metal substrate. Since a plurality of film fabrication steps to be subsequently applied to this metal substrate include a high-temperature process of about 800° C., a heat-resistant alloy containing elemental Cr was employed for this metal substrate.

By means of ion beam sputtering method, a Cr layer having a thickness of 50 nm was deposited directly on the surface of the Ni-based alloy base body. Likewise, by means of ion beam sputtering method, a $Gd_2Zr_2O_7$ layer constituting a first intermediate layer was deposited on the Cr layer under the conditions shown in the following Table 1, thereby preparing a sample.

Subsequently, under the conditions of: 100% oxygen atmosphere and a pressure of 1 atm, the sample was subjected to a heat treatment at a temperature of up to 500° C. Then, cross-sectional observation of the resultant sample was performed by means of a transmission electron microscope (TEM). As a result, it was possible to confirm that an oxide layer containing chromium oxide as a major component and having a thickness of about 50 nm was formed at an interface between the metal substrate and the intermediate layer.

Further, by means of a scanning electron microscope (SEM) and an optical microscope, the surface of the sample was observed at a magnification of 100-10000 times. However, the delamination of layer was not recognized.

Then, by means of ion beam sputtering method, magnetron sputtering method and pulse laser deposition method, the formation of intermediate layers constituting a second layer, a third layer and a fourth layer (IBAD-MgO layer, $LaMnO_3$ layer and $CeO_2$ layer) was performed under the conditions shown in the following Table 1. Thereafter, by means of pulse laser deposition method, a superconductive layer consisting of $GdBa_2Cu_3O_{7-d}$ and having a thickness of 1600 nm was deposited on the uppermost intermediate layer under the conditions of about 800° C. and 600 mTorr (a partial pressure of $O_2$).

After finishing the formation of the superconductive layer, the surface of the laminate structure was observed by means of SEM and an optical microscope. However, the delamination of layer was not recognized.

Further, the superconductive characteristics of the sample were determined using the standard four-probe method. As a result, it was also possible to confirm excellent superconductive characteristics represented by a critical current (Ic) of not less than 200 A and a critical current density (Jc) of not less than $1.0 \times 10^6$ A/cm$^2$ both on the basis of a voltage of 1 μV/cm.

TABLE 1

|  | CeO$_2$ | LMO | IBAD-MgO | GZO | Y$_2$O$_3$ | Al$_2$O$_3$ |
|---|---|---|---|---|---|---|
| System | PLD | RF-Magn. | Dual Ion Beam | Ion Beam | RF-Magn. | RF-Magn. |
| Making power | 560 mJ | 300 W | 200 mA | 700 mA | 400 W | 400 W |
|  | 180 Hz |  | 1.0 kV | 1.2 kV |  |  |
| Film forming temperature | 500-600° C. | 500-600° C. | RT | RT | RT | RT |
| Processing pressure | 10 mTorr | 4 mTorr | 0.3 mTorr | 0.4 mTorr | 7-30 mTorr | 6 mTorr |
| Film forming rate | 202 A/s | 2.4 A/s | 0.7 A/s | 1.5 A/s | 0.4 A/s | 1.7 A/s |
| Film thickness | 500 nm | 28 nm | 3-4 nm | 110 nm | 10 nm | 160 nm |
| Manufacturing speed | 4.8 m/h | 20 m/h | 3 m/h | 20 m/h | 16 m/h | 3.8 m/h |

Notes:
The conditions for the assist beam in the IBAD process were 20-30 mA and 700-800 V;
The laser energy of CeO$_2$ was based on the observed value;
The film forming rate was an average rate in RTR; and
Forming a multi-layer was repeated five times at 24 m/h in the case of CeO$_2$ and twice at 7.6 m/h in the case of Al$_2$O$_3$.

Example 2

A base member made of Ni-based alloy (Hastelloy; trademark: Ni-16Cr-15.6Mo-6Fe-4W-2Co) and roll-worked into a tape-like film having a width of 10 mm and a thickness of 100 μm was employed as a metal substrate. Because of the reasons that an oxide layer containing chromium oxide as a major component is to be formed by way of oxygen annealing treatment after depositing an intermediate layer and that a plurality of film fabrication steps to be subsequently applied to this metal substrate include a high-temperature process of about 800° C., a heat-resistant Ni-based alloy containing elemental Cr was employed for this metal substrate. Further, in order to enhance the characteristics for use as an orientated substrate to be used for the manufacture of a superconductive wire, the surface of the metal substrate was polished to have an arithmetic average roughness Ra of 10 nm.

By means of ion beam sputtering method, a $Gd_2Zr_2O_7$ layer constituting an intermediate layer was deposited directly on the surface of the metal substrate under the conditions shown in the above Table 1, thereby preparing a sample. Since this $Gd_2Zr_2O_7$ layer is capable of acting as a seed layer for prompting the formation of the orientated structure of the IBAD-MgO layer to be deposited in the next step, any heat treatment was not applied to this $Gd_2Zr_2O_7$ layer, thereby making it possible to maintain the amorphous or microcrystal state thereof.

Under the conditions of: 100% oxygen atmosphere and a pressure of 1 atm, the sample thus obtained was subjected to oxygen annealing treatment at a temperature of up to 500° C. Thereafter, the resultant sample was worked using a converging ion beam and then the cross-sectional observation of the resultant sample was performed by means of a transmission electron microscope (TEM). As a result, a contrast indicating differences in composition or structure was found near the surface of the metal substrate. When this surface region was investigated by means of EDX analysis, it was possible to confirm the formation of an oxide layer containing chromium oxide as a major component and having a thickness of about 20 nm.

Further, when the surface of $Gd_2Zr_2O_7$ layer was observed at a magnification of 100-10000 times by means of SEM at this time, the delamination of layer was not recognized.

Furthermore, by means of ion beam sputtering method, magnetron sputtering method and pulse laser deposition method, IBAD-MgO layer, $LaMnO_3$ layer and $CeO_2$ layer were deposited under the conditions shown in the above Table 1. Finally, by means of pulse laser deposition method, a superconductive layer consisting of $GdBa_2Cu_3O_{7-d}$ and having a thickness of 1600 nm was deposited on the uppermost layer under the conditions of about 800° C. and 600 mTorr (a partial pressure of $O_2$).

After finishing the formation of the superconductive layer, the surface of the laminate structure was observed by means of SEM. However, the delamination of layer was not recognized.

Example 3

A base member made of Ni-based alloy (Hastelloy; trademark: Ni-16Cr-15.6Mo-6Fe-4W-2Co) and roll-worked into a tape-like film having a width of 10 mm and a thickness of 100 μm was employed as a metal substrate. Because of the reasons that a plurality of deposition steps to be subsequently applied to this metal substrate include a high-temperature process of about 800° C. and that an oxide layer containing chromium oxide as a major component is enabled to be formed in this high-temperature process, a heat-resistant alloy containing elemental Cr was employed for this metal substrate. Further, in order to enhance the characteristics for use as an orientated substrate to be used for the manufacture of a superconductive wire, the surface of the metal substrate was polished to have an arithmetic average roughness Ra of 10 nm.

By means of ion beam sputtering method and pulse laser deposition method, an $Al_2O_3$ layer and intermediate layers ($Y_2O_3$, IBAD-MgO, $LaMnO_3$ and $CeO_2$) were deposited directly on the surface of the metal substrate under the conditions shown in the above Table 1.

Finally, by means of pulse laser deposition method, a superconductive layer consisting of $GdBa_2Cu_3O_{7-d}$ and having a thickness of 1200 nm was deposited on the uppermost layer under the conditions of about 800° C. and 600 mTorr (a partial pressure of $O_2$), thereby preparing a sample.

As a result of observation of the cross-section of the sample by means of TEM, it was possible to confirm the formation of an oxide layer containing chromium oxide as a major component at an interface between the metal substrate and the $Al_2O_3$ layer. Further, when the surface of the sample was observed by means of SEM, the delamination of layer was not recognized.

Example 4

A base member made of Ni-based alloy (Hastelloy; trademark: Ni-16Cr-15.6Mo-6Fe-4W-2Co) and roll-worked into a tape-like film having a width of 10 mm and a thickness of 100 μm was employed as a metal substrate. Because of the reasons that an oxide layer containing chromium oxide as a major component is to be formed by way of oxygen annealing treatment after the deposition of an intermediate layer and that a plurality of film formation steps to be subsequently applied to this metal substrate include a high-temperature process of about 800° C., a heat-resistant Ni-based alloy containing elemental Cr was employed for this metal substrate. Further, in order to enhance the characteristics for use as an orientated substrate to be used for the manufacture of a superconductive wire, the surface of the metal substrate was polished to have an arithmetic average roughness Ra of 10 nm.

By means of ion beam sputtering method and pulse laser deposition method, an $Al_2O_3$ layer and an $Y_2O_3$ layer were deposited directly on the surface of the metal substrate formed of the Ni-based alloy under the conditions shown in the above Table 1, thereby preparing a sample.

Under the conditions of: 100% oxygen atmosphere and a pressure of 1 atm, the sample thus obtained was subjected to oxygen annealing treatment at a temperature of up to 500° C. Thereafter, the resultant sample was worked using a converging ion beam and then the cross-sectional observation of the resultant sample was performed by means of a transmission electron microscope (TEM). As a result, a contrast indicating differences in composition or structure was found near the surface of the metal substrate. When this surface region was investigated by means of EDX analysis, it was possible to confirm the formation of an oxide layer containing chromium oxide as a major component and having a thickness of 50 nm.

Further, when the surface of $Y_2O_3$ layer was observed at a magnification of 100-10000 times by means of SEM at this time, the delamination of layer was not recognized.

Furthermore, by means of ion beam sputtering method, magnetron sputtering method and pulse laser deposition method, IBAD-MgO layer, $LaMnO_3$ layer and $CeO_2$ layer were deposited under the conditions shown in the above Table 1. Finally, by means of pulse laser deposition method, a superconductive layer consisting of $GdBa_2Cu_3O_{7-d}$ and having a thickness of 1200 nm was deposited on the uppermost layer under the conditions of about 800° C. and 600 mTorr (a partial pressure of $O_2$).

After finishing the formation of the superconductive layer, the surface of the laminate structure was observed by means of SEM. However, the delamination of layer was not recognized.

Comparative Example 1

If appropriate heat treatment to a metal substrate containing Cr or to a metal substrate having a Cr layer or the deposition of an $Al_2O_3$ layer as described in Examples 1-4 are not carried out, it is impossible to enable to form an oxide layer containing chromium oxide as a major component at an interface between the metal substrate and the intermediate layer. Because of this, it is impossible to enable a diffusion-preventing function to sufficiently work in a superconductive wire and therefore when the superconductive wire is exposed to a high-temperature environment, an interlayer reaction (mutual diffusion of elements) is allowed to proceed, leading to the delamination of layers.

A sample having a layer structure consisting of GdBCO/Epi-MgO/IBAD-MgO/$Y_2O_3$/Ni-based alloy (laminated in the mentioned order from the top) was manufactured without subjecting the sample to a heat treatment in an oxygen atmosphere after forming the intermediate layers. When this sample was subjected to a process of fabricating a superconductive layer (GdBCO) to be carried out under the film-forming temperature conditions of about 800° C., it was possible to recognize the delamination of the upper layer containing GdBCO in such a manner as to make it flake-like as shown in FIG. 1.

Likewise, a sample having a layer structure consisting of $LaMnO_3$/Epi-MgO/IBAD-MgO/$Y_2O_3$/Ni-based alloy was manufactured without subjecting the sample to a heat treatment in an oxygen atmosphere after the deposition of the intermediate layers. When this sample was also exposed to a high-temperature environment on depositing the $LaMnO_3$ layer. As a result, delamination was confirmed as shown in FIG. 2.

Further, when these samples were analyzed by means of ED spectrum, the delamination of upper layers from the IBAD-MgO layer was recognized in both of these samples as shown in FIG. 3. This phenomenon was confirmed along with cracking being observed on the surface of the IBAD-MgO layer. However, it was found possible to prevent delamination by carrying out heat treatment under appropriate conditions or by carrying out heat treatment after the formation of an $Al_2O_3$ layer as described in Examples 1-4.

According to the present invention, it is possible to provide a substrate for superconductive film fabrication, which is capable of avoiding delamination at an interface between fabricated films during the process of fabricating a film or in the heat treatment to be performed after the fabrication of a film. Further, it is made possible, through the employment of such a substrate, to manufacture oxide superconductive wires which are excellent in superconductive characteristics and in reliability while making it possible to enhance productivity and manufacturing speed and to reduce the manufacturing cost. Accordingly, the present invention is excellent in terms of industrial applicability in the oxide superconductive wire-manufacturing industries.

What is claimed is:

1. A method of manufacturing a substrate for superconductive film formation, comprising:
    providing a metal substrate consisting of Ni-based alloy or Fe-based alloy, the alloy containing Cr at a ratio of 10-30 mass %;
    forming a barrier layer containing $Al_2O_3$ on the metal substrate;
    forming an intermediate layer on the barrier layer, and
    heating the metal substrate to a temperature of not higher than 700° C. in an atmosphere containing oxygen to thereby form, between the metal substrate and the barrier layer, an oxide layer containing chromium oxide as a major component and having a thickness of 10-300 nm and an arithmetic average roughness Ra of not more than 50 nm.

2. The method according to claim 1, wherein the intermediate layer contains $Y_2O_3$ or $Gd_2Zr_2O_7$.

3. The method according to claim 1, wherein the intermediate layer has an arithmetic average roughness Ra of not more than 50 nm.

4. The method according to claim 1, wherein the metal substrate has an arithmetic average roughness Ra of not more than 50 nm.

5. A method of manufacturing a superconductive wire, comprising:
    providing a metal substrate consisting of Ni-based alloy or Fe-based alloy, the alloy containing Cr at a ratio of 10-30 mass %;
    forming a barrier layer containing $Al^2O^3$ on the metal substrate;
    forming an intermediate layer on the barrier layer; and
    depositing a superconductive film on the intermediate layer under a temperature of not lower than 750° C., thereby forming, between the metal substrate and the barrier layer, an oxide layer containing chromium oxide as a major component and having a thickness of 10-300 nm and an arithmetic average roughness Ra of not more than 50 nm.

* * * * *